United States Patent [19]

Nagataki

[11] Patent Number: 5,712,576
[45] Date of Patent: Jan. 27, 1998

[54] SEMICONDUCTOR INTEGRATED CIRCUIT DEVICE HAVING INPUT CIRCUIT WITHOUT INFLUENCE ON RELIABILITY OF DIAGNOSIS

[75] Inventor: Yuichiro Nagataki, Tokyo, Japan

[73] Assignee: NEC Corporation, Tokyo, Japan

[21] Appl. No.: 594,991

[22] Filed: Jan. 31, 1996

[30] Foreign Application Priority Data

Feb. 2, 1995 [JP] Japan ................................. 7-035898

[51] Int. Cl.$^6$ ................................................ G01R 31/02
[52] U.S. Cl. .................................... 324/763; 371/22.6
[58] Field of Search ................................ 324/763, 765; 371/22.5, 22.6; 437/8; 257/48

[56] References Cited

U.S. PATENT DOCUMENTS 4,743,841  5/1988  Takeuchi ................................. 324/763
5,485,095  1/1996  Bertsch et al. ......................... 324/537

Primary Examiner—Vinh P. Nguyen
Assistant Examiner—Russell M. Kobert
Attorney, Agent, or Firm—Whitham, Curtis, Whitham & McGinn

[57] ABSTRACT

A semiconductor integrated circuit device receives an input signal from an external wiring through an input transistor coupled to one of external leads, and a transfer gate is coupled between the external lead and a constant voltage source so as to provide a terminal resistance to the external wiring; however, the transfer gate is turned off in a test to see whether or not the input transistor is defective so as to enhance the reliability of the diagnosis.

9 Claims, 5 Drawing Sheets

SEMICONDUCTOR INTEGRATED CIRCUIT DEVICE HAVING INPUT CIRCUIT WITHOUT INFLUENCE ON RELIABILITY OF DIAGNOSIS

FIELD OF THE INVENTION

This invention relates to a semiconductor integrated circuit device and, more particularly, to a semiconductor integrated circuit device having an input circuit coupled to end resistive elements without influence on reliability of a diagnosis.

DESCRIPTION OF THE RELATED ART

A semiconductor integrated circuit device is usually mounted on a printed board, and forms an electronic system together with other system components. The leads of the semiconductor integrated circuit device are connected to signal lines extending on the printed board. The signal lines propagates electric signals to the leads, and are taken into the integrated circuit. Input transistors are incorporated in the integrated circuit, and the electric signals reach the input transistors respectively assigned thereto.

The input impedance of the input transistor is usually much larger than the characteristic impedance of the signal line, and, for this reason, the electric signal is terminated at the gate electrode of the input transistor by means of an end resistor. The end resistors are usually accommodated in a package together with the semiconductor chip, and are connected to the leads as follows.

FIG. 1 illustrates a typical example of the semiconductor integrated circuit device, and largely comprises a semiconductor chip 1, a plurality of leads 2a, 2b and 2c, end resistors 3a and 3b and a package 4 for accommodating the semiconductor chip 1 and the end resistors 3a and 3b. An integrated circuit is fabricated on the semiconductor chip 1, and is broken down into an internal circuit 1a and an input circuit 1b. Signal pads 1c and 1d and n-channel enhancement type input transistors Qn1 and Qn2 form the input circuit 1b, and the n-channel enhancement type input transistors Qn1 and Qn2 are coupled in parallel between a power voltage line Vdd and the internal circuit 1a. The leads 2a and 2b are respectively connected to the pads 1c and 1d, and input signals Sin1 and Sin2 are propagated from the leads 2a and 2b through the pads 1c and 1d to the gate electrodes of the n-channel enhancement type input transistors Qn1 and Qn2, respectively. The input signals Sin1 and Sin2 respectively switch the n-channel enhancement type input transistors Qn1 and Qn2, and the n-channel enhancement type input transistors Qn1 and Qn2 relay the input signals Sin1 and Sin2 to the internal circuit 1a.

The end resistors 3a and 3b are respectively associated with the leads 2a and 2b, and are connected between the associated leads 2a and 2b and the other lead 2c. Though not shown in FIG. 1, a constant potential level is applied to the lead 2c.

While the manufacturer is fabricating the semiconductor integrated circuit device, the integrated circuit is checked to see whether or not a defective circuit component is incorporated therein. For example, when the integrated circuits are completed on the semiconductor wafer, a tester (not shown) supplies test signals through the pads 1c and 1d to the gate electrodes of the n-channel enhancement type input transistors Qn1 and Qn2, and checks the current consumption to see whether or not leakage current flows through the gate oxide layers of the n-channel enhancement type input transistors Qn1 and Qn2. If the diagnosis indicates that the integrated circuit is excellent, the semiconductor wafer is separated into semiconductor chips 1, and the semiconductor chip 1, the end resistors 3a and 3b and the leads 2a to 2c are sealed in the package 4. After the packaging, the manufacturer repeats the test through the leads 2a and 2b, and diagnoses the semiconductor integrated circuit device.

The end resistors may be formed on a semiconductor chip as shown in FIG. 2. In detail, the second prior art semiconductor integrated circuit device comprises a semiconductor chip 5, a plurality of leads 6a, 6b and 6c and a package 7. An integrated circuit is fabricated on the semiconductor chip 5, and is also broken down into an internal circuit 5a and an input circuit 5b. Pads 5c to 5e and n-channel enhancement type input transistors Qn3 and Qn4 form parts of the input circuit 5b together with end resistors 5f and 5g, and the end resistors 5f and 5g are connected in parallel between the pads 5c/5d and the pad 5e. A constant potential level is applied through the lead 6c to the pad 5e.

Input signals Sin3 and Sin4 reach the leads 6a and 6b, respectively, and are transferred from the leads 6a and 6b through the pads 5c and 5d to the gate electrodes of the n-channel enhancement type input transistors Qn3 and Qn4, respectively. The input signals Sin3 and Sin4 switch the n-channel enhancement type input transistors Qn3 and Qn4, and are relayed to the internal circuit 5a.

The second prior art semiconductor integrated circuit device is also subjected to the tests before delivery from the manufacturing factory. Namely, the tester (not shown) applies test signals to the pads 5c and 5d before the packaging, and repeats the test by supplying the test signals to the leads 6a and 6b after the packaging.

The end resistors 3a/3b and 5f/5g make the diagnosis nonsense. Of course, when the test is carried out by applying the test signals to the pads 1c and 1d before the packaging, the diagnosis is reliable, because the end resistors 3a and 3b have not been connected to the pads 1c ad 1d yet. However, the end resistors 3a/3b affect the diagnosis through the application of the test signals to the leads 2a/2b, and the end resistors 5f/5g have the influence on the diagnosis before and after the packaging. In detail, when the end resistors 3a/3b or 5f/5g are connected to the pads 1c/1d or 5c/5d, the test signals are applied to not only the gate electrodes of the n-channel enhancement type input transistors Qn1/Qn2 or Qn3/Qn4 but also the end resistors 3a/3b or 5f/5g. In this situation, the current flows through a parallel circuit, i.e., a first current path implemented by a gate resistance of the associated n-channel enhancement type input transistor and a second current path implemented by an internal resistance of a power source and the end resistor. The second current path is much smaller in resistance than the first current path. For this reason, most of the current passes through the second current path, and only a small amount of current flows across the gate oxide of the associated n-channel enhancement type input transistor as leakage current. The tester measures the total amount of current passing through both of the first and second current paths, and can not separate the current passing through the first current path from the total current. Therefore, the tester is expected to diagnose the n-channel enhancement type input transistors Qn1/Qn2 or Qn3/Qn4 on the basis of an extremely small amount of variation of the current, and is liable to make an error.

If the tester electrically isolates the lead 2c/6c from the source of the constant potential level or makes the lead 2c/6c remain open, the current does not flow through the second current path. However, the end resistors 3a/3b or 5f/5g are

3 electrically connected to the source of the constant potential, and the tester can not identify the defective input transistor Qn1/Qn2 or Qn3/Qn4.

Thus, the end resistors 3a/3b or 5f/5g affect the diagnosis of the n-channel enhancement type input transistors Qn1/Qn2 or Qn3/Qn4, and the diagnosis of the n-channel enhancement type input transistors Qn1/Qn2 or Qn3/Qn4 is not reliable.

SUMMARY OF THE INVENTION

It is therefore an important object of the present invention to provide a semiconductor integrated circuit device a diagnosis of which is reliable regardless of end resistive elements.

To accomplish the object, the present invention proposes to shift end resistive elements between on-state and off-state depending upon a mode of operation.

In accordance with the present invention, there is provided a semiconductor integrated circuit device comprising a plurality of external leads including at least one first lead coupled to an external signal source for receiving an input signal, a second lead for receiving a control signal and a third lead applied with a constant potential level; an internal circuit for processing an internal signal; and an input circuit coupled between the plurality of external leads and the internal circuit, and including at least one input transistor having a first control node coupled to the at least one first lead and a first conductive path coupled to the internal circuit and responsive to the input signal for supplying the internal signal to the internal circuit, and a variable resistor element having a second control node coupled to the second lead and a second conductive path coupled between the third lead and a first control node and responsive to the control signal for changing the second conductive path between high impedance state and low impedance state, the second conductive path in the high impedance state being not smaller in resistance than the input impedance of the at least one input transistor, the second conductive path in the low impedance state providing a terminal resistance to the external signal source.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
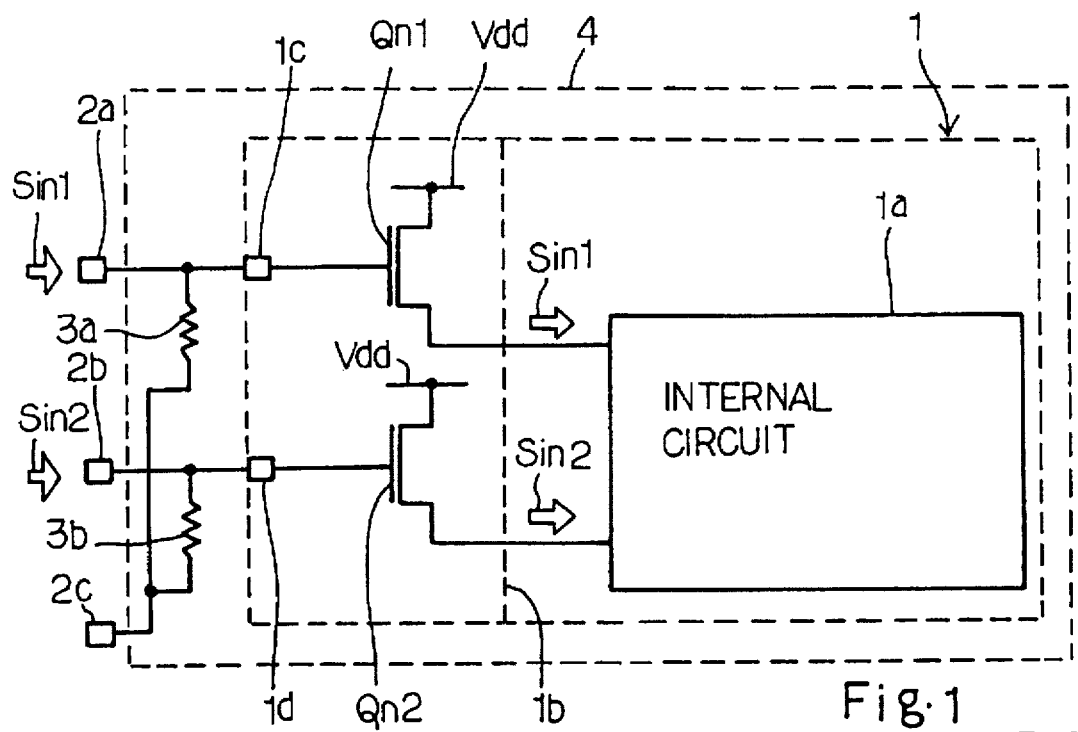
FIG. 1 is a circuit diagram showing the circuit arrangement of the first prior art semiconductor integrated circuit device.
Figure 2:
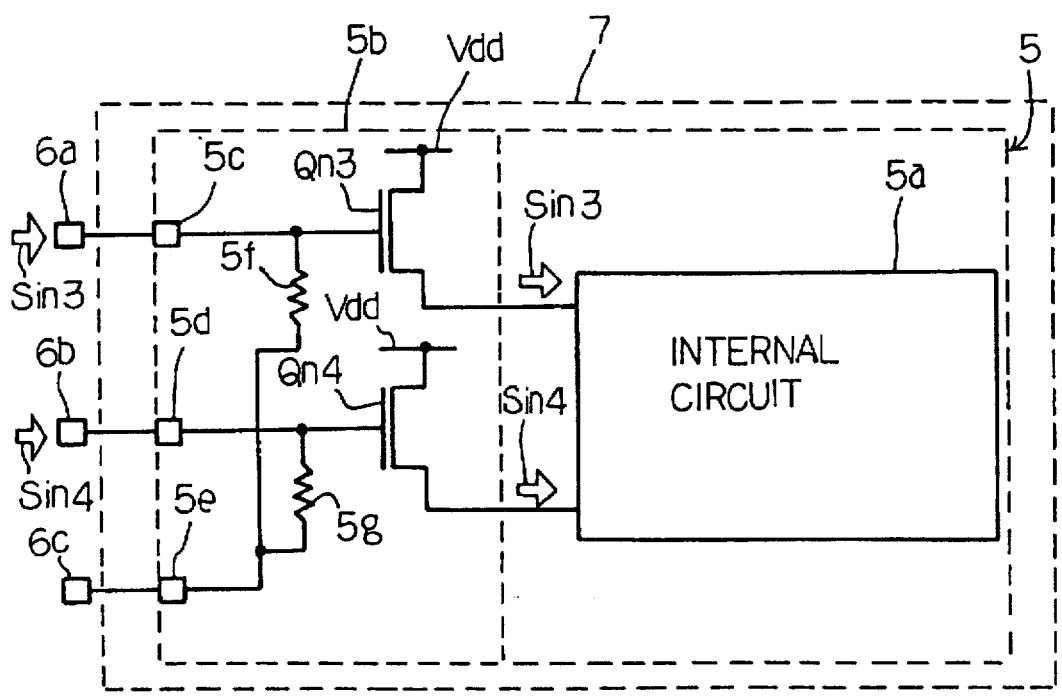
FIG. 2 is a circuit diagram showing the circuit arrangement of the second prior art semiconductor integrated circuit device.
Figure 3:
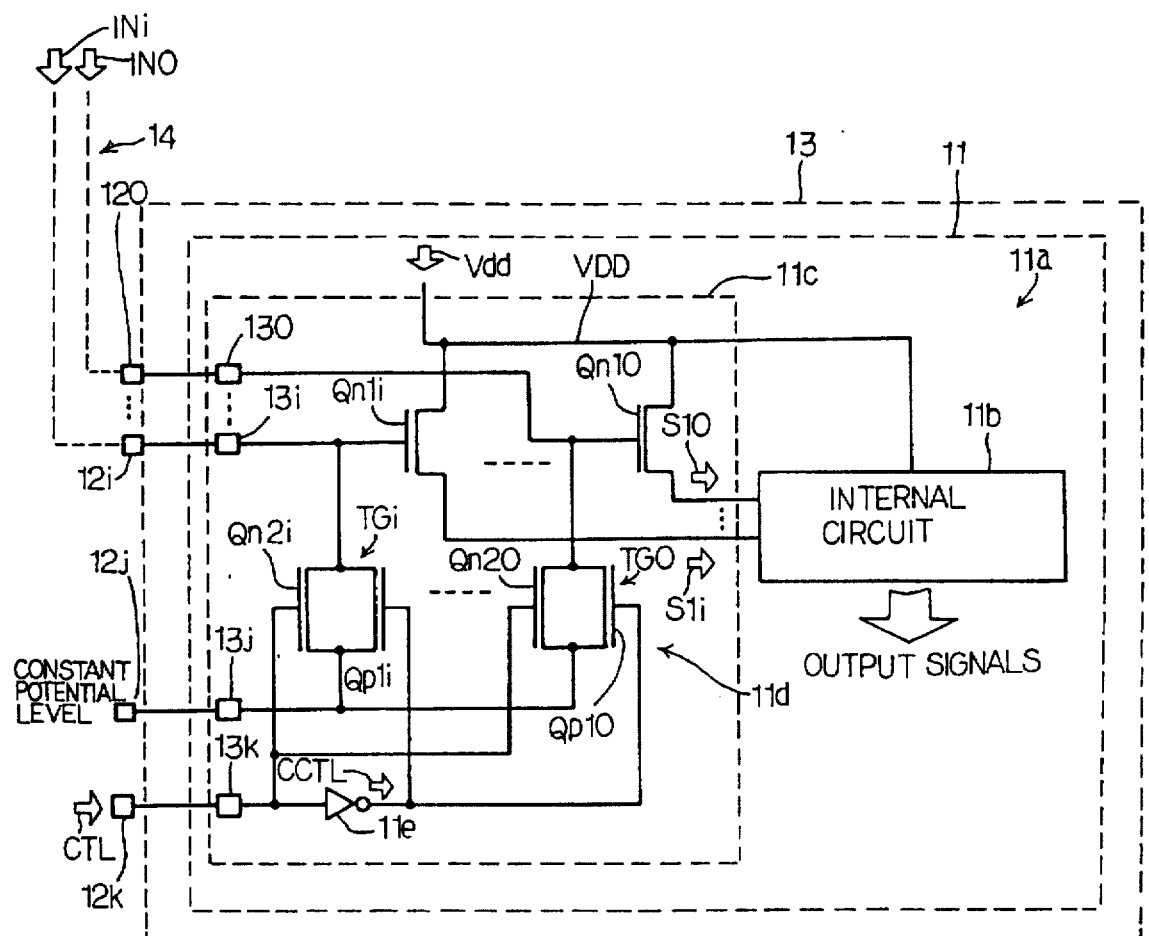
FIG. 3 is a circuit diagram showing the circuit arrangement of a semiconductor integrated circuit device according to the present invention.

Referring to FIG. 3 of the drawings, a semiconductor integrated circuit device embodying the present invention largely comprises a semiconductor chip 11, leads 120 to 12i, 12j and 12k and a package 13. The leads 120 to 12i are connected to external signal lines 14, and input signals IN0 to INi are supplied from a signal source (not shown) through the external signal lines 14 to the leads 120 to 12i. A source of constant potential level is connected to the lead 12j, and a control signal CTL is supplied from a tester (not shown) to the lead 12k. The signal source and the external signal lines 14 as a whole constitute an external signal source, and each of the leads 120 to 12i serves as at least one first lead. The lead 12k and the lead 12j serve as a second lead and a third lead, respectively.

An integrated circuit 11a is fabricated on the semiconductor chip 11, and is broken down into an internal circuit 11b and an input circuit 11c. The input circuit 11c receives the input signals IN0 to INi from the leads 120 to 12i, and supplies internal signals S10 to S1i to the internal circuit 11b. The internal circuit 11b processes the internal signals 130 to Sli, and generates output signals.

The input circuit 11c includes a plurality of pads 130 to 13i, 13j and 13k, a plurality of n-channel enhancement type input transistors Qn10 to Qn1i and an analog switch unit 11d. The plurality of pads 130 to 13i, 13j and 13k are respectively associated with the n-channel enhancement type input transistors Qn10 to Qn1i, and the other leads 12j and 12k are provided for the analog switch unit 11d.

The pads 130 to 13i are respectively connected between the leads 120 to 12i and the gate electrodes of the n-channel enhancement type input transistors Qn10 to Qn1i, and the input signals IN0 to INi are transferred from the leads 120 to 12i through the pads 130 to 13i to the gate electrodes of the n-channel enhancement type input transistors Qn10 to Qn1i, respectively.

When the input signals IN0 to INi are in a high level, the associated n-channel enhancement type input transistors Qn10 to Qn1i turn on, and provide respective conductive channels from a positive power voltage line VDD to the internal circuit 11b. The internal signals S10 to S1i are changed to a positive potential level Vdd, and are propagated through the conductive channels to the internal circuit 11b. On the other hand, when the input signals IN0 to INi are changed to a low level, the n-channel enhancement type input transistors Qn10 to Qn1i turn off, and the conductive channels are removed. As a result, the internal signals S10 to S1i are changed to a low level.

A plurality of transfer gates TG0 to TGi and an inverter 11e form in combination the analog switch unit 11d, and each of the transfer gates TG0 to TGi is implemented by a parallel combination of an n-channel enhancement type field effect transistor Qn20, . . . or Qn2i and a p-channel enhancement type field effect transistor Qp10, . . . or Qp1i. The pad 13j is connected to the common source nodes of the transfer gates TG0 to TGi, and the common drain nodes of the transfer gates TG0 to TGi are respectively connected to the gate electrodes of the n-channel enhancement type input transistors Qn10 to Qn1i. The pad 13k is connected to not only the gate electrodes of the n-channel enhancement type field effect transistors Qn20 to Qn2i but also the input node of the inverter 11e, and the output node of the inverter 11e is connected to the gate electrodes of the p-channel enhancement type field effect transistors Qp10 to Qp1i.

When the control signal CTL is in a high level such as a positive high voltage level Vdd, the inverter 11e generates the complementary control signal CCTL, and the control signal CTL and the complementary control signal CCTL cause the n-channel enhancement type field effect transistors Qn10 to Qn1i and the p-channel enhancement type field effect transistors Qp10 to Qp1i to concurrently turn on.

On the other hand, if the control signal CTL is changed to a low level such as the ground level, the inverter 11e changes the complementary control signal CCTL to the high level, and the control signal CTL and the complementary control signal CCTL cause the n-channel enhancement type field effect transistors Qn20 to Qn2i and the p-channel enhancement type field effect transistors Qp10 to Qp1i to concurrently turn off.

Thus, the transfer gates TG0 to TGi concurrently turn on and off, and are changed between off-state and on-state. When the transfer gates TG0 to TGi are in the off-state, the transfer gates TG0 to TGi are not smaller in resistance than the gate resistances of the n-channel enhancement type input transistors Qn10 to Qn1i or the input resistances, and concurrently enter into the high impedance state.

On the other hand, while the transfer gates TG0 to TGi are staying in the on-state, the transfer gates TG0 to TGi provide appropriate terminal resistances to the external signal source. Therefore, the on-state is corresponding to the low impedance state. The on-resistance of each transfer gate TG0/TGi is determined by the dimensions of the channels of the n-channel/p-channel enhancement type field effect transistors Qn20/Qp10, ... or Qn2i/Qp1i, and is easily adjustable to the terminal resistance.

In this instance, each of the transfer gates TG0 to TGi and the inverter form in combination an analog switch, and the analog switch serves as a variable resistor element.

Figure 4:
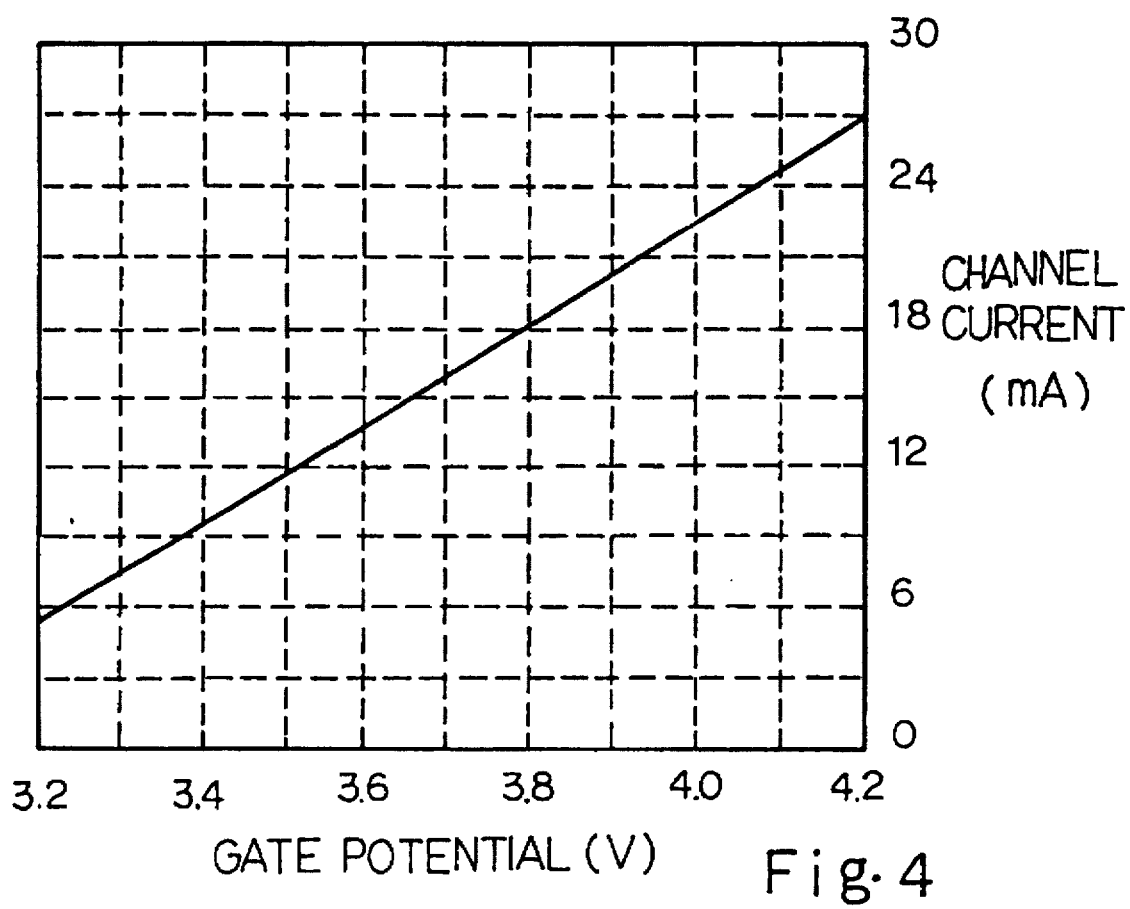
FIG. 4 is a graph showing a gate voltage-to-channel current characteristics of an analog switch unit incorporated in the semiconductor integrated circuit device.
Figure 5:
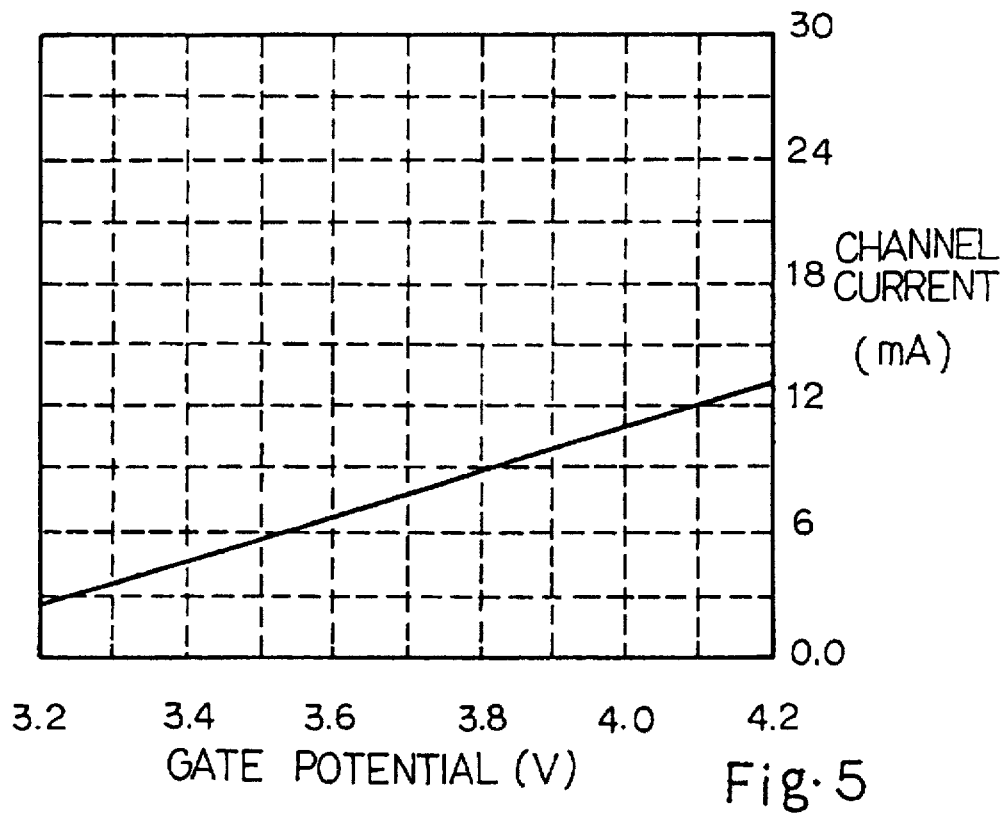
FIG. 5 is a graph showing a gate voltage-to-channel current characteristics of another analog switch unit different in channel dimensions from the analog switch unit.

FIG. 4 shows a gate voltage-to-channel current characteristics of the analog switch obtained through a simulation. The pad 13j was supplied with 3.7 volts, and the potential level at the gate electrode of the transfer gate was varied from 4.2 volts to 3.2 volts. The transfer gate gradually decreased the channel current, and the channel resistance was calculated about 50 ohms. However, if the channel of the analog switch was scaled down, the channel current was proportionally decreased as shown in FIG. 5, and the channel resistance was calculated about 100 ohms. Thus, the channel dimensions directly affect the channel resistance, and the channel resistance is easily adjusted to the terminal resistance.

Figure 6:
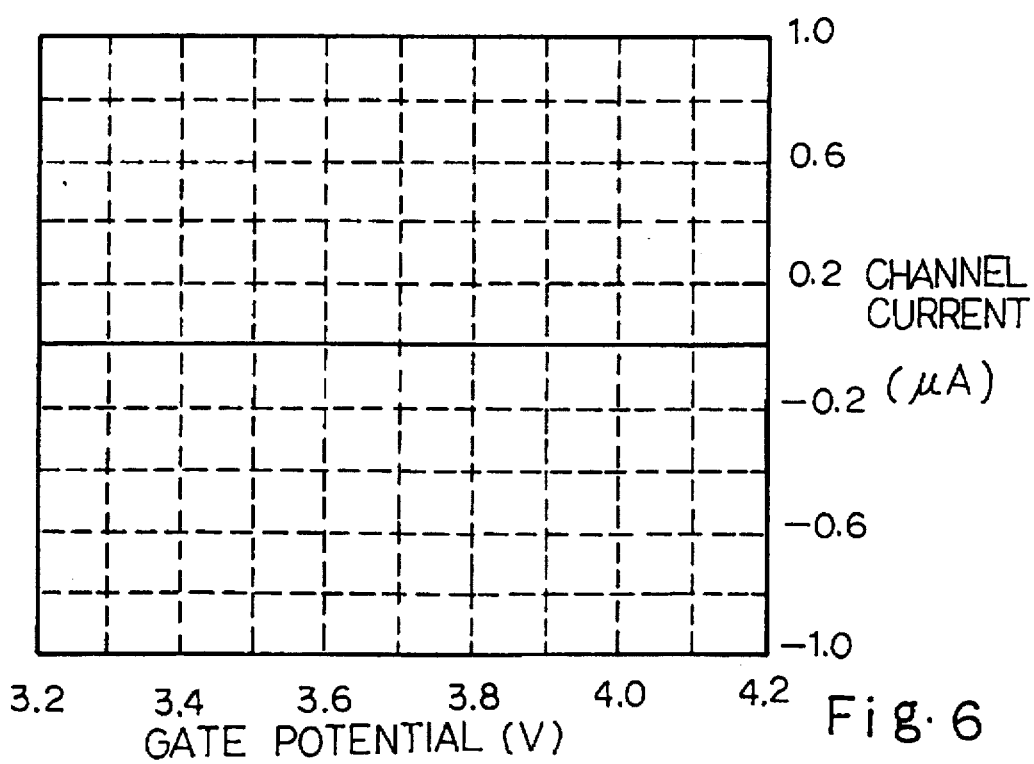
FIG. 6 is a graph showing a channel current of the analog switch unit in the off-state.

While the analog switch was being turned off, no current flowed through the analog switch as shown in FIG. 6. Thus, no leakage current flows through the analog switch in the off-state, and, accordingly, the analog switch is not smaller in resistance than the gate resistance of the n-channel enhancement type input transistor Qn10/Qn1i.

Figure 7:
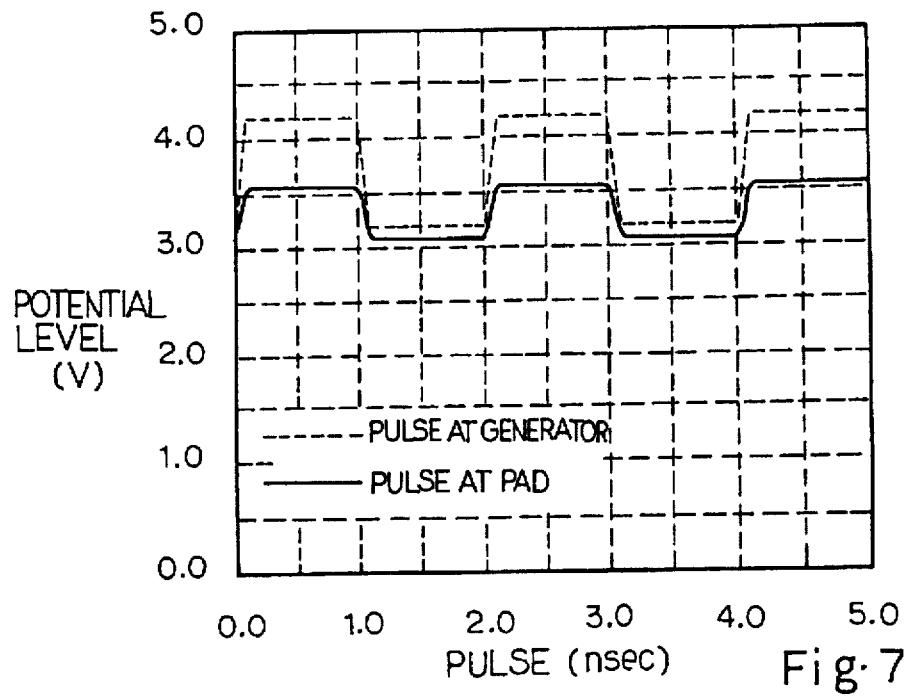
FIG. 7 is a graph showing the pulse response characteristics of the analog switch unit.

Using the analog switch with the channel resistance of 50 ohms, the pulse response characteristics were simulated as shown in FIG. 7. The pulse generator was zero ohms in internal resistance, and was sequentially connected through a resistor of 50 ohms to the gate electrodes of the n-channel enhancement type input transistors Qn10/Qn1i. While a pulse train at 500 MHz was being applied from the pulse generator to the pad 130/13i, the waveform at the pad 130/13i was exactly overlapped with the waveform at the pulse generator, and the present inventor confirmed that the analog switch does not have undesirable influence on the input transistors Qn10/Qn1i.

When the manufacturer checks the semiconductor integrated circuit device before a separation of the semiconductor wafer into the semiconductor chips 11, a tester (not shown) is connected to the pads 130 to 13i and 12k, and supplies the control signal of the low level. The transfer gates TG0 to TGi turn off, and electrically isolate the pads 130 to 13i from one another. The tester sequentially applies a test voltage to the pads 130 to 13i to see whether or not the amount of leakage current exceeds a critical level. The transfer gates TG0 to TGi do not allow current to flow therethrough, and the current detected by the tester is the leakage current only. For this reason, the tester exactly diagnoses the n-channel enhancement type input transistors Qn10 to Qn1i.

Upon completion of the packaging, the manufacturer repeats the test. The tester is connected to the leads 120 to 12i and 12k, and supplies the control signal CTL of the low level to the lead 12k. The transfer gates TG0 to TGi turn off, and allows the tester to independently check the n-channel enhancement type input transistors Qn10 to Qn1i.

When a user installs the semiconductor integrated circuit device into an electronic system, the high level is supplied through the lead 12k, and the lead 12j is connected to a constant voltage source appropriate to the end resistances. The transfer gates TG0 to TGi turn on, and provide the end resistances to the external signal source.

As will be understood from the foregoing description, the analog switch unit or the variable resistor element is changed to the off-state, and allows a tester to individually diagnose the n-channel enhancement type input transistors Qn10 to Qn1i without the influence of the terminal resistor. Therefore, the test enhances the reliability of the n-channel enhancement type input transistors and, accordingly, the semiconductor integrated circuit device.

Second Embodiment

Figure 8:
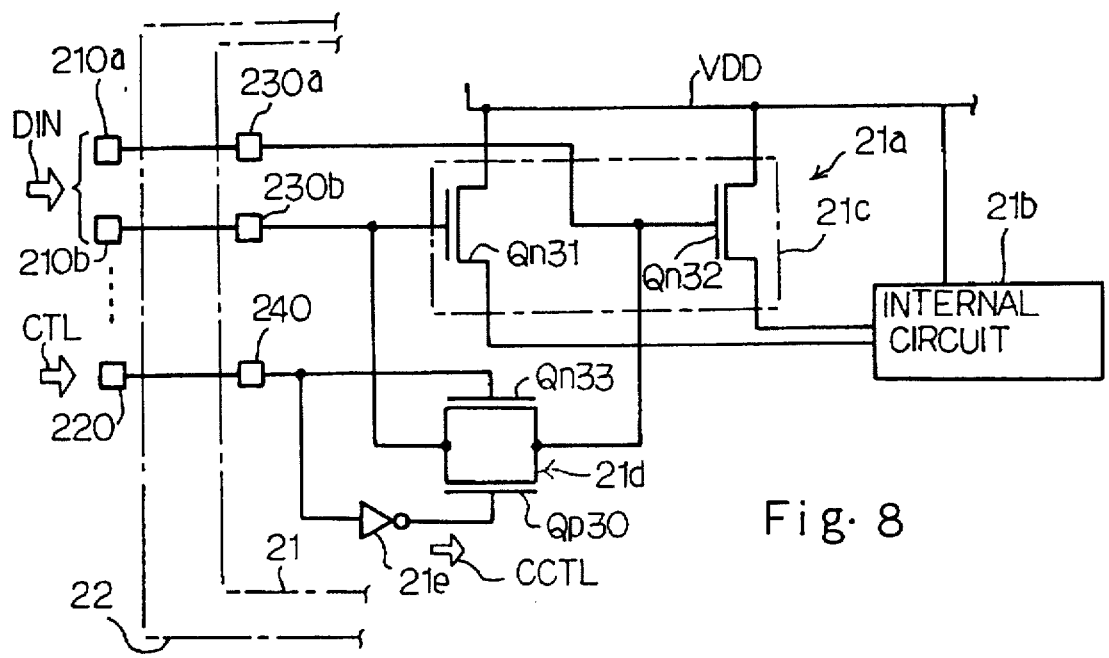
FIG. 8 is a diagram showing the circuit arrangement of an input circuit incorporated in another semiconductor integrated circuit device according to the present invention.

Turning to FIG. 8 of the drawings, another semiconductor integrated circuit device embodying the present invention largely comprises a semiconductor chip 21, leads 210a/210b, ... and 220 and a package 22. An input circuit 21a and an internal circuit 21b are fabricated on the semiconductor chip 21 as similar to the first embodiment, and a transistor pair 21c or a pair of n-channel enhancement type field effect transistors Qn31/Qn32 is incorporated in the input circuit 21a. A differential input signal DIN is supplied from the leads 210a/210b through pads 230a/230b to the transistor pair 21c, and the n-channel enhancement type field effect transistors Qn31 and Qn32 complementarily turn on and off. In this instance, the transistor pair 21c serves as at least one input transistor, and the leads 210a and 210b as a whole constitute at least one first lead.

A transfer gate 21d or a parallel combination of an n-channel enhancement type field effect transistor Qn33 and a p-channel enhancement type field effect transistor Qp30 is coupled between the pads 230a and 230b, and a control signal CTL is supplied to the lead 220. The control signal CTL is transferred from the lead 220 through the pad 240 to the gate electrode of the n-channel enhancement type field effect transistor Qn33 and an input node of an inverter 21e, and the inverter 21e supplies the complementary control signal CCTL to the gate electrode of the p-channel enhancement type field effect transistor Qp30.

The transfer gate 21d and the inverter 21e form in combination an analog switch unit, and the analog switch unit serves as a variable resistor element. The lead 220 serves as a second lead, and the leads 210a and 210b alternately serve as a third lead.

The semiconductor integrated circuit device behaves as similar to the first embodiment, and the input circuit 21a achieves all the advantages of the input circuit 11c.

Although particular embodiments of the present invention have been shown and described, it will be obvious to those skilled in the art that various changes and modifications may be made without departing from the spirit and scope of the present invention. For example, the n-channel enhancement type input transistors may be replaced with bipolar transistors. The analog switch unit may be sealed in the package together with a semiconductor chip where an internal circuit and an input circuit are fabricated. The channel conductivity type of the input transistors may be opposite to the input transistors of the first and second embodiments.

What is claimed is:

1. A semiconductor integrated circuit device comprising
   a plurality of external leads including at least one first lead coupled to an external signal source for receiving an input signal, a second lead for receiving a control signal and a third lead applied with a constant potential level;
   an internal circuit for processing an internal signal; and
   an input circuit coupled between said plurality of external leads and said internal circuit, and including
      at least one input transistor having a first control node coupled to said at least one first lead and a first conductive path coupled to said internal circuit and responsive to said input signal for supplying said internal signal to said internal circuit, and
      a variable resistor element having a second control node coupled to said second lead and a second conductive path coupled between said third lead and said first control node and responsive to said control signal for changing said second conductive path between high impedance state and low impedance state, said second conductive path in said high impedance state being not smaller in resistance than said input impedance of said at least one input transistor, said second conductive path in said low impedance state providing a terminal resistance to said external signal source.

2. The semiconductor integrated circuit device as set forth in claim 1, in which said internal circuit and said input circuit are fabricated on a single semiconductor chip.

3. The semiconductor integrated circuit device as set forth in claim 2, a plurality of pads are further fabricated on said single semiconductor chip, and are electrically coupled between said plurality of leads and said input circuit.

4. The semiconductor integrated circuit device as set forth in claim 1, in which said input transistor is a field effect transistor having a gate electrode serving as said first control node.

5. The semiconductor integrated circuit device as set forth in claim 1, in which said variable resistor element includes
   an inverter coupled to said second lead for generating a complementary control signal and
   a parallel combination of field effect transistors different in channel conductivity type and having gate electrodes serving as said second control node and coupled to said second lead and said inverter, respectively.

6. The semiconductor integrated circuit device as set forth in claim 1, in which said at least one first lead and said at least one input transistor have respective sub-leads supplied with input sub-signals complementary to each other and respectively field effect transistors having respective gate electrodes supplied with said input sub-signals, respectively.

7. The semiconductor integrated circuit device as set forth in claim 6, in which one of said sub-leads coupled to one of said gate electrodes serves as said third lead, and said variable resistor element is coupled between said one of said gate electrodes and the other of said gate electrodes.

8. A semiconductor integrated circuit device comprising
   a plurality of external leads including a plurality of first leads coupled to an external signal source for receiving input signals, a second lead for receiving a control signal and a third lead applied with a constant potential level; and
   a semiconductor chip including
      an internal circuit for processing internal signals,
      a plurality of pads coupled to said plurality of external leads, respectively,
      an input circuit coupled between said plurality of pads and said internal circuit, and having
         a plurality of input transistors having respective first gate electrodes connected to pads coupled to said plurality of first leads and respective first channels coupled between a source of power voltage and said internal circuit, said plurality of input transistors being independently responsive to said input signals for supplying said internal signals to said internal circuit, respectively,
         an inverter having an input node coupled to one of said plurality of pads coupled to said second lead and an output node for generating a complementary control signal, and
         a plurality of parallel circuits each implemented by field effect transistors different in channel conductivity type from each other and having respective second gate electrodes supplied with said control signal and said complementary control signal, respectively,
         said plurality of parallel circuits being associated with said plurality of input transistors, respectively, and having second channels coupled between said first gate electrodes of the associated input transistors and said third lead,
         said plurality of parallel circuits being responsive to said control signal and said complementary control signal for changing said second channels between off-state and on-state providing a terminal resistance to said external signal source.

9. A semiconductor integrated circuit device comprising
   a plurality of external leads including first leads paired with each other and coupled to an external signal source for receiving input signals complementary to each other and a second lead for receiving a control signal; and
   a semiconductor chip including
      an internal circuit for processing internal signals,
      a plurality of pads coupled to said plurality of external leads, respectively,
      an input circuit coupled between said plurality of pads and said internal circuit, and having
         input transistors paired with each other and having respective first gate electrodes connected to pads coupled to said first leads and respective first channels coupled between a source of power voltage and said internal circuit, said plurality of input transistors being responsive to said input signals for supplying said internal signals to said internal circuit,
         an inverter having an input node coupled to one of said plurality of a pad coupled to said second lead and an output node for generating a complementary control signal, and
         a parallel circuit of field effect transistors different in channel conductivity type from each other and having respective second gate electrodes supplied with said control signal and said complementary control signal, respectively,
         said parallel circuit having a second channel coupled between the pad coupled to one of said first leads and the pad coupled to the other of said first leads and responsive to said control signal and said complementary control signal for changing said second channel between off-state and on-state providing a terminal resistance to said external signal source.

* * * * *